United States Patent [19]

Chapron

[11] 4,137,469
[45] Jan. 30, 1979

[54] THRESHOLD-EFFECT INTEGRATED INJECTION LOGIC CIRCUIT WITH HYSTERESIS

[75] Inventor: Claude Chapron, Caen, France

[73] Assignee: U.S. Philips Corporation, New York, N.Y.

[21] Appl. No.: 807,041

[22] Filed: Jun. 16, 1977

[30] Foreign Application Priority Data

Jun. 22, 1976 [FR] France .................................. 76 18922

[51] Int. Cl.² ..................... H03K 3/286; H03K 3/295; H03K 17/30; H03K 19/08
[52] U.S. Cl. ............................. 307/291; 307/200 A; 307/213; 307/247 R; 307/247 A; 307/299 B; 357/92
[58] Field of Search ............... 307/213, 247 A, 247 R, 307/289–292, 299 B, 200 A; 357/92

[56] References Cited

U.S. PATENT DOCUMENTS

| | | | |
|---|---|---|---|
| 3,471,718 | 10/1969 | Weisz | 307/290 |
| 3,581,120 | 5/1971 | Nord | 307/290 |
| 3,922,565 | 11/1975 | Berger et al. | 307/213 |
| 3,993,918 | 11/1976 | Sinclair | 307/288 X |
| 4,009,397 | 2/1977 | Mulder et al. | 307/214 X |
| 4,013,898 | 3/1977 | Makino | 307/290 X |
| 4,051,389 | 9/1977 | Kaneko et al. | 357/92 X |
| 4,056,736 | 11/1977 | Blatt | 307/289 |
| 4,065,680 | 12/1977 | Russell | 307/213 X |

OTHER PUBLICATIONS

Pedersen, "Integrated Injection Logic: a Bipolar LSI Technique"; *Computer* (pub.) (IEEE–publisher); vol. 9, No. 2, pp. 24–29; 2/1976.

*Primary Examiner*—Larry N. Anagnos
*Attorney, Agent, or Firm*—Thomas A. Briody; James J. Cannon, Jr.

[57] ABSTRACT

A threshold-effect integrated logic circuit of the I²L type with hysteresis including a trigger circuit and an amplifier. The difference between the two voltage thresholds of the trigger circuit is controlled by an interrupting unit, and is equal to the voltage drop across a diode. The difference between each threshold and the output level results in an immunity to long-term spurious signals and static noise.

10 Claims, 6 Drawing Figures

THRESHOLD-EFFECT INTEGRATED INJECTION LOGIC CIRCUIT WITH HYSTERESIS

The present invention relates to a threshold-effect integrated logic circuit with hysteresis. The invention comprises a trigger circuit constituted by a first and a second injection transistor, the collector of each transistor being connected to the base of the other transistor, their common emitter being at a first voltage level, and the first transistor being provided with a second collector which is connected to the output terminal.

Current-injection logic circuits of the I²L type are known whose structure comprises at least one current injector, formed by semiconductor regions of alternate conductivity types, which inject a current into the bases of complementary transistors, which are said to be controlled, while they are themselves controlled by so-called controlling transistors. The circuits realized in accordance with the I²L technique include threshold-effect devices with hysteresis which enable logic operations to be performed with a certain noise immunity, for example the device which is the object of the Applicant's French patent application No. 75 12 480 filed on Apr. 22, 1975, and corresponding to U.S. patent application Ser. No. 815,266, which is hereby incorporated by reference entitled: "Threshold device for integrated logic circuits." This prior art device which has a hysteresis transfer characteristic, receives input signals with a certain voltage excursion and spurious or noise signals and supplies a regenerated signal with a steep front. In certain cases a signal with a specific excursion is to be obtained without the application of external electrical power, but as a result of a mechanical action or by a simple contact, for example connection to ground. The present invention provides a solution to the last-mentioned problem, in particular in the case that two stages of a current injection circuit are powered in series, each stage corresponding to a voltage drop of approximately 0.7 V, i.e. the voltage drop across a P/N-junction diode.

According to the present invention, the threshold-effect integrated logic circuit with hysteresis, comprises a trigger circuit constituted by a first and a second injector transistor, the collector of each transistor being connected to the base of the other transistor, their common emitter being at a first voltage level. The first transistor is provided with a second collector which is connected to an output terminal, and the base of the second transistor is connected to an input terminal of the circuit via at least one diode, the base of said first transistor is connected to the collector of the output transistor of a current amplifier which comprises an odd number of injection transistors whose common emitter is at the first voltage level. The base of the input transistor of the amplifier is connected to the input terminal, and interruption means are provided in a connection between the input terminal and the voltage reference point. The current supplied by the injector of the input transistor is greater than the current supplied by the injector of the transistor which is controlled by said input transistor. The sum of the internal voltage drop across the diode and the voltage drop which may be introduced by the interruption means in the closed position is smaller than the sum of the voltage at the first level and the internal voltage drop across the emitter-base junction of the transistor.

The circuit in accordance with the present invention does not require an input signal generator, the trigger circuit being controlled in one direction by the connection between the input terminal and the voltage reference point and, in contradistinction thereto, in the other direction by the interruption of said connection. The operation of the trigger circuit is as follows:

1. When the connection between the input terminal and the voltage reference point is interrupted, the voltage at the input terminal increases, the amplifier being energized by the injector of the input transistor of the amplifier. The input transistor of the amplifier conducts and as a result of this the output transistor of the amplifier also conducts, while the transistors of even order are turned off, the first transistor of the trigger circuit is turned off and the output terminal, which is connected to a collector of said first transistor, assumes a potential which corresponds to a first state "1."
2. When the input terminal is connected to the point of reference potential, this voltage drop causes the states of all the transistors of the trigger circuit and the amplifier to change, so that they pass from the cut-off state to the conductive state or the other way round, the first transistor of the trigger circuit being turned on, the potential of the output terminal approximates to the first voltage level and the output goes to a second state "0" (the indications 0 and 1 assigned to the states of the output terminal being merely chosen to distinguish them from each other).

In the diagram of FIG. 1 of the accompanying drawing the various voltage levels at the input terminal of the circuit are shown. The two thresholds at which the trigger circuit changes over are:

1. From the 0-state to the 1-state of the output: the trigger circuit changes over when the voltage at the input terminal reaches a value $V_{SH}$ equal to the sum of the voltage $V_M$ at the first level and the base-emitter voltage of the input transistor of the amplifier at the minimum turn-on current of this transistor.
2. From the 1-state to the 0-state of the output: the trigger circuit changes over when the voltage at the input terminal decreases to a value $V_{SB}$ equal to the sum of the base-emitter voltage of the second transistor of the trigger circuit at the minimum base current for which this transistor conducts, minus the voltage drop across the interposed diode.

The difference $V_E$ between the thresholds, which determines the amplitude of the hysteresis characteristic, which is thus substantially equal to the voltage drop across the intermediate diode, is appreciable relative to the voltage excursion at the input terminal.

The circuit in accordance with the invention has all the advantages of current injection devices, in particular it enables a high integration density and only demands a very low supply voltage. It is to be noted that the current through the trigger circuit is for the greater part also used in the controlled device at the output. The current consumption of the circuit in accordance with the invention is minimal and does not necessitate the use of a control current source or a control signal.

The circuit moreover has a difference between the trigger levels and the input voltage levels corresponding to the 0 to 1-states.

The rising threshold is attained upon turn-on of the input transistor of the amplifier causing the first transistor of the trigger circuit to be turned off, when the voltage at the input terminal of the circuit reaches a value $V_{SH}$ equal to the sum of the voltage at the first level and the base-emitter voltage of said input transistor at the minimum turn-on current, and the high level is obtained for a voltage $V_H$ at the input terminal of the circuit which equals the sum of the voltage at the first level and the base-emitter voltage of the same input transistor at the maximum current supplied by its injector. As the voltage drop across the base-emitter junction varies with the current through a transistor, a substantial difference $V_{IH}$ is obtained between the trigger level of the trigger circuit and the high level at which the output of the device stabilizes itself at the 1-state, since the difference between the currents supplied by the injector of the input transistor of the amplifier and the injector of the transistor driven by the input transistor. This difference $V_{IH}$, at least for the high level, results in immunity to static noise and in particular long-term spurious signals.

Furthermore, the falling threshold is reached when the second transistor of the trigger circuit is turned off if the voltage at the input terminal of the circuit decreases to a value $V_{SB}$ equal to the sum of the voltage at the first level and the base-emitter voltage of the said second transistor, minus the voltage drop across the intermediate diode, and the low level is obtained for a voltage $V_B$ at the input terminal of the circuit which equals the voltage drop $V_C$ which may be introduced by interrupting means in the closed position. The above-mentioned requirement with which the interruption means should comply results in a difference $V_{IB}$ between the trigger level of the trigger circuit and the low level at which the output of the device stabilizes itself at the 0-state. This difference $V_{IB}$, for the low level, yields an immunity to low frequency noise, in particular to continuous or slow spurious signals which may be introduced by the voltage reference point and the interruption means.

In a first embodiment the voltage at the first level being equal to the voltage drop across a P/N-junction diode (i.e. approximately 0.7 V in a silicon integrated circuit for example, a stage of an I²L circuit which is operated between the first level and ground). The intermediate diode is a P/N-junction diode and the difference between the thresholds is then substantially equal to the internal voltage drop across a P/N junction. This comparatively great difference generally suffices to get rid of short spurious noise signals which for example in the case of an interruption circuit used in an industrial environment are mainly constituted by short pulses of rather high amplitude.

In the preceding case in which the intermediate diode is a P/N-junction diode and in which the voltage at the first level equals the voltage drop across a P/N-junction diode, the interruption means is advantageously constituted by contact breaker between metallic conductors producing a negligible voltage drop. The difference between the low level and the falling threshold in this case equals the base-emitter voltage of the second transistor.

In the same case the interruption means may also be constituted by a collector-emitter circuit of a transistor, the voltage drop between the emitter and the collector of this switching transistor in the conductive state being smaller than the internal voltage drop across a P/N-junction.

In a different embodiment in which the voltage at the first level relative to the voltage reference point is zero, the intermediate diode is a metal semiconductor diode of the Schottky type whose internal voltage drop is smaller than that across a P/N semiconductor junction diode, the internal voltage drop being for example of the order of 0.4 V.

The amplifier which controls the trigger circuit comprises an odd number of cascaded transistors, each transistor being operated as an inverter. It is possible to use an amplifier which comprises a single transistor only which is at the same time the input transistor and the output transistor of the amplifier. Preferably, the amplifier is constituted by an assembly of three cascaded transistors, each having a gain higher than 1. This arrangement enables the circuit in accordance with the invention to be formed with a comparatively homogeneous range of transistors, yet providing a substantial difference between the currents supplied by the injector of the input transistor of the amplifier and that of the transistor which is controlled by the input transistor. Advantageously the ratio between the current supplied by the two above injectors is greater than 10 and a gain of the three amplifier transistors is greater than 3.

The following description with reference to the accompanying drawings enables the invention to be more fully understood.

Figures 1, 2:
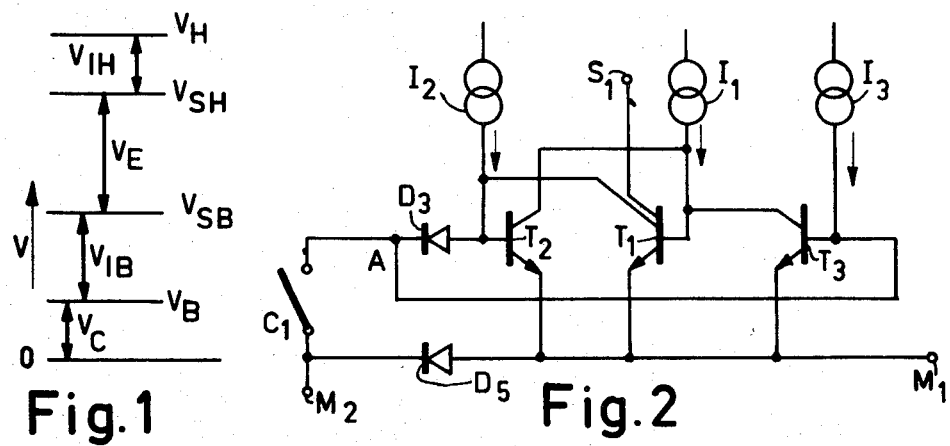
FIG. 1 is a diagram indicating relative voltage levels in the circuit according to the present invention.
FIG. 2 is the diagram of a circuit in accordance with the invention, whose amplifier comprises a single transistor.

The circuit whose diagram is shown in FIG. 2 comprises a trigger circuit formed by two NPN-transistors $T_1$ and $T_2$. The first transistor $T_1$ comprises two collectors, of which one collector is connected to the output terminal $S_1$. The two transistors each have a collector connected to the base of the other transistor.

The emitters are coupled and connected to a terminal $M_1$ at a first voltage level $V_{M1}$. The transistors $T_1$ and $T_2$ have an I²L structure and are provided with injectors $I_1$ and $I_2$ respectively. The base of the transistor $T_2$ is connected to a voltage reference terminal $M_2$ via a P/N-junction diode $D_3$ and interrupting means $C_1$. The base of the transistor T1 is driven by a transistor $T_3$ with an I²L structure and having an injector $I_3$ whose base is connected to an input point A of the circuit, between the interrupting means $C_1$ and the diode $D_3$. Between the terminal $M_1$ and the voltage reference point $M_2$ there is provided a circuit across which the overall voltage drop is equivalent to that of a P/N-junction diode, which is represented by the diode $D_5$. The internal voltage drop across the diode $D_3$ is substantially equal to the internal voltage drop of the diode $D_5$. In this circuit arrangement the amplifier controlling the first transistor of the trigger circuit comprises a single transistor $T_3$, which at the same time constitutes the input transistor and the output transistor of the amplifier.

The circuit arrangement of FIG. 2 does not require an electrical control signal, the change-over of the interrupting means $C_1$ being sufficient to change the state of the output $S_1$. If $C_1$ is open the injector $I_3$ supplies a current which causes the voltage at point A to rise, the transistor $T_3$ is turned on when the voltage at A attains a value $V_{SH1}$ equal to the sum of the voltage $V_{DS}$ at the level $M_1$ and the base-emitter voltage $V_{BET3}$ of the transistor $T_3$ at the minimum turn-on current of this transistor. This value $V_{SH1}$ is the rising threshold. The injector $I_3$ supplies a current which is substantially greater than said minimum current, the voltage at A increases and is maintained at a level $V_{H1}$ corresponding to the same voltage sum as $V_{SH1}$ but for the total current supplied by $I_3$ and injected into $T_3$, the difference between $V_{SH1}$ and $V_{H1}$ resulting from the variation of the base-emitter voltage of $T_3$, substantially in accordance with the formula:

$$\Delta V = \frac{kT}{q} \text{Log} \frac{i_1 + i_3}{i_1(1 + \frac{1}{\beta})}$$

in which k is Boltzmann's constant, T the absolute temperature, q the electron charge, $i_1$ the collector current of the transistor $T_3$ injected by $I_1$, and $i_3$ the base current of the transistor $T_3$ injected by $I_3$.

The difference between $V_{SH1}$ and $V_{H1}$ constitutes a margin which assures a substantial noise immunity and which enables the device to be rid of long-term voltage variations or spurious noise signals.

If $C_1$ is closed, the voltage at point A decreases to the reference voltage at $M_2$ or the voltage 0, but for the voltage drop $V_{C1}$. The trigger circuit and the output $S_1$ change over as soon as the voltage at point A changes from the value $V_{SB1}$ which is equal to the sum of the voltage $V_{DS}$ at the level $M_1$ and the base-emitter voltage of the transistor $T_2$ minus the voltage drop $V_{D3}$ in the diode $D_3$, i.e. in total substantially the base-emitter voltage of the transistor $T_2$. The difference between $V_{SB1}$ and the reference 0 or, as the case may be, the voltage $V_{C1}$, constitutes an appreciable margin which enables voltage drift, long-term spurious noise and ground faults to be eliminated.

The difference between $V_{SH1}$ and $V_{SB1}$, which substantially equals the voltage drop across the diode $D_3$, determines the amplitude of the hysteresis of the circuit, which assures that the device is immune to short-term spurious noise signals whose amplitude is generally much higher than that of long-term spurious signals.

Figure 3:
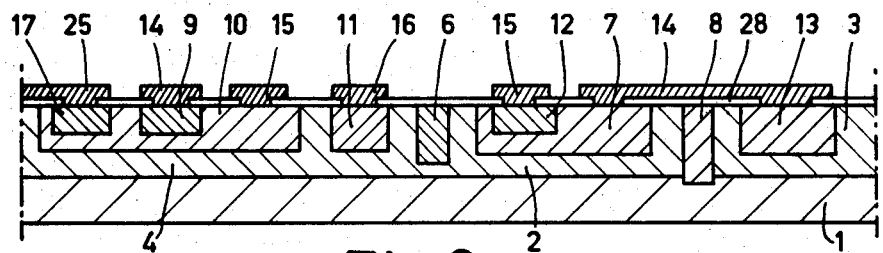
FIG. 3 is a schematic cross section of the circuit of FIG. 2 taken on the line I—I of FIG. 4.
Figure 4:
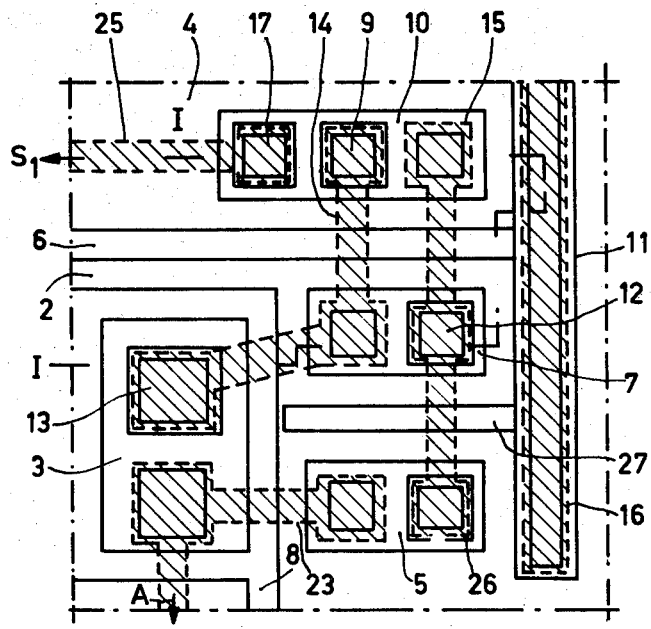
FIG. 4 is a plan view of the same circuit.

FIGS. 3 and 4 show a possible form of realizing the circuit of FIG. 2. It is to be noted that in the plan view of FIG. 4 the contact openings formed in the transparent oxide coating which covers the integrated circuit are represented by continuous lines, which is also the case with the boundaries of the diffused regions, and the metal tracks deposited on the chip for obtaining the necessary connections are presented by dashed lines. The device is realized starting from a P-type substrate 1 in which islands 2 and 3 of N-type conductivity are formed by an isolation zone 8. In a part 4 of the island 2 the inverse transistor $T_1$ is formed whose emitter is constituted by the part 4, whose base is formed by a diffused region 10, and whose collectors are formed by the regions 9 and 17 which have been diffused in the base 10. The injector of this transistor is constituted by the lateral PNP structure with three regions, constituted by the P-type region 11 which is diffused in the island 2, the island itself and the base 10. The same structure is found for the transistor $T_2$ which like transistor $T_1$ is of the inverse NPN type and whose base is a P-type region 7, whose emitter is a region of the island 2 and whose collector is an N-type region 12. Similarly, the injector of the transistor $T_2$ is constituted by the region 11, the island 2 and the region 7. In a part of the island 2 the amplifier transistor $T_3$ is situated, whose emitter is formed by the island 2 itself, whose base is formed by P-type region 5 and whose collector is formed by an N-type diffused region 26. In the island 3 the diode $D_3$ is formed whose two regions are the P-type diffused region 13 and the N-type island 3. The various parts of the island 2 are separated by heavily doped N+type diffused zones 6 and 27.

The collector 26 of the transistor $T_3$ is connected to the collector 12 of the transistor $T_2$ and to the base 10 of $T_1$ via a metal track 15; the base 7 of the transistor $T_2$ is connected to the collector 9 of the transistor $T_1$ and to the diode $D_3$ by a metal track 14. The other region 3 of the diode $D_3$ is connected to the interrupting means, not shown, and so is the base 5 of the transistor $T_3$, by a metal track 23. The contacts are formed via openings in the insulating layer 28 which covers the chip.

The collector 17 of the transistor $T_1$ is connected to an output terminal via a metal track 25 and the injector currents are applied via a metal track 16 which contacts the region 11 over the whole length. Dye to tis $I^2L$ type structure, the circuit allows a high integration density to be obtained; it can be realized by means of conventional integrated circuit fabrication techniques.

Figure 5:
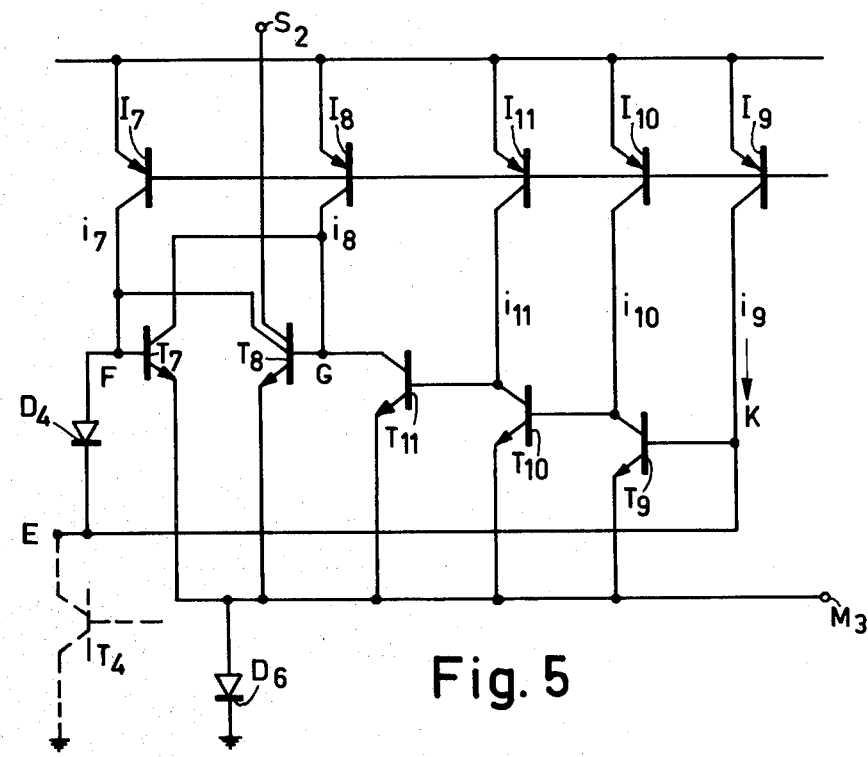
FIG. 5 is the diagram of another circuit embodiment in accordance with the invention whose amplifier comprises three transistors.

FIG. 5 shows the diagram of an other circuit in accordance with the invention whose amplifier is formed by three cascaded transistors $T_9$, $T_{10}$ and $T_{11}$ and whose trigger circuit is formed by the transistors $T_7$ and $T_8$. All the emitters are coupled to the point $M_3$ which has a specific voltage relative to ground corresponding to the voltage drop in a circuit equivalent to a diode $D_6$. Interrupting means constituted by a transistor $T_4$ connect or do not connect point E to ground which is also connected to the base of $T_7$ via a diode $D_4$ and to the base of the input transistor $T_9$ of the amplifier. The injectors of the transistors $T_7$ to $T_{11}$ are represented by injector transistors $I_7$ to $I_{11}$ supplying injection currents $i_7$ to $i_{11}$. The second collector of the transistors $T_8$ is connected to the output of the circuit $S_2$. The diode $D_4$ is a P/N-junction diode and the internal voltage drop across this diode is of the same order as the voltage drop in the circuit which is equivalent to the diode 6, which is for example a stage of an $I^2L$ circuit.

The device whose diagram is given in FIG. 5 can be realized in accordance with known techniques for the fabrication of $I^2L$ circuits from a silicon chip comprising an epitaxial layr in which regions of different conductivity type are implanted and/or diffused in isolating islands. The transistors, $T_7$ to $T_{11}$ are inverse NPN transistors whose emitters are parts of the islands formed in the epitaxial layer. The injector transistors $I_7$ to $I_{11}$ have a lateral structure, their bases are formed by parts of the islands formed in the epitaxial layer and their collectors are constituted by the bases of the injected transistors.

The internal voltage drops across the diode $D_4$ and the base-emitter junctions of the transistors $T_7$ and $T_9$ are of the order of 0.7 V. The voltage drop introduced by the collector-emitter circuit of the transistor $T_4$ in the conductive state is of the order of 0.3 V.

The currents supplied by the injectors $I_7$, $I_8$ and $I_9$ are for example 100 nA, the current supplied by the injector $I_{10}$ being 10 nA and the current supplied by the injector $I_{11}$ being 30 nA. The current gain of the transistors $T_9$, $T_{10}$ and $T_{11}$ is higher than 3 in the present example. These different characteristics are obtained with assembly of elements which are consistent with respect to the dimensions and nature of the materials.

The circuit thus realized has an hysteresis with an amplitude of 0.7 V, the difference between the rising threshold of the trigger circuit and the "high" input level is of the order of 60 mV, and the difference between the falling threshold of the trigger circuit and the "low" input level is of the order of 0.4 V, as a function of the voltage drop in the interrupting means $T_4$.

Figure 6:
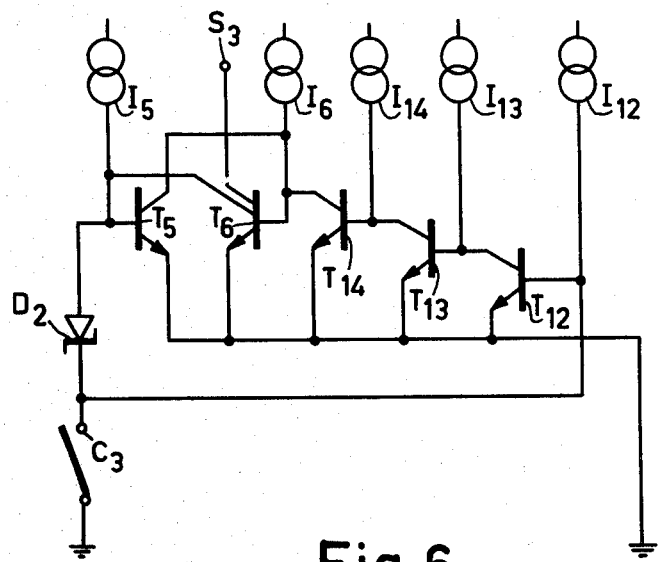
FIG. 6 is the diagram of a different circuit embodiment in accordance with the invention.

FIG. 6 gives the diagram of another circuit in accordance with the invention whose amplifier also consists of three cascaded transistors $T_{12}$, $T_{13}$ and $T_{14}$. The trigger circuit consists of the transistors $T_5$ and $T_6$, one of the two collectors of the last-mentioned transistors being connected to an output terminal $S_3$. The emitters of the transistors $T_5$, $T_6$, $T_{12}$, $T_{13}$ and $T_{14}$ are all connected to ground. The base of the transistor $T_5$ is connected to the base of the input transistor of the amplifier via a metal semiconductor diode $D_2$ of the Schottky type. A contact breaker $C_3$ can connect or not connect the base of $T_{12}$ and the diode $D_2$ to ground. The transistors $T_5$, $T_6$, $T_{12}$, $T_{13}$, $T_{14}$ are injector transistors, whose injectors are $I_5$, $I_6$, $I_{12}$, $I_{14}$ respectively. Such a circuit may have an hysteresis with an amplitude of 0.4 V corresponding to the internal voltage drop across the diode $D_2$, an upper threshold voltage of 0.650 V and a lower threshold voltage of 0.250 V, while the difference between the upper threshold and the high level may be 50 to 100 mV depending upon the characteristics of the amplifier and the injectors.

What is claimed is:

1. A threshold-effect integrated injection logic circuit with hysteresis comprising:

first and second voltage terminals;

a trigger circuit including an input and an output; a diode having first and second terminals, said first terminal being connected to said input; a first and a second transistor each having an emitter, a base, and one or more collectors, a collector of each transistor being connected to the base of the other transistor, the emitters of said first and said second transistors being connected together and to said first voltage terminal having a first voltage level, said first transistor including a second collector connected to said output, the base of said second transistor being connected to said second terminal of said diode;

a current amplifier comprising n switching transistors, where n is an odd integer, each having an emitter, a base, and one or more collectors, the emitters of said n switching transistors being connected together and being at said first voltage level, said n switching transistors comprising an input transistor having a base connected to said input, a controlled transistor connected to and controlled by said input transistor, having an emitter, a base, and a collector, and an output transistor having a base, an emitter, and a collector, said collector of said controlled transistor being connected to said base of said output transistor, and said collector of said output transistor being connected to the base of said first transistor;

a plurality of current injectors connected to corresponding ones of said switching transistors for supplying current thereto, said current supplied to said input transistor being greater than the current supplied to said controlled transistor; and interruption means connected between said input and said second voltage terminal having an open state and a closed state;

the sum of the internal voltage drop across the said diode and the voltage drop introduced by said interruption means in the closed state being smaller than the sum of said voltage level and the internal voltage drop across the emitter-base junction of said controlled transistor.

2. An integrated injection logic circuit as claimed in claim 1, wherein said diode is a P/N junction diode, said first voltage level being equal to the voltage drop across a P/N junction.

3. An integrated injection logic circuit as claimed in claim 1, wherein said diode is a metal semiconductor diode of the Schottky type, said first voltage level being lower than that of said second voltage level.

4. An integrated injection logic circuit as claimed in claim 1, wherein said interrupting means comprises a switch with direct metal contacts.

5. An integrated injection logic circuit as claimed in claim 1 wherein said interrupting means comprises the collector-emitter path of a further transistor.

6. An integrated injection logic circuit as claimed in claim 1, wherein said current amplifier comprises three cascaded transistors, each having an emitter, a base, and a collector, the collector of one of said cascaded transistors being connected to the base of the adjacent cascaded transistor.

7. An integrated injection logic circuit as claimed in claim 6, wherein the gain of said switching transistors is greater than 3.

8. An integrated injection logic circuit as claimed in claim 1, wherein said first and second transistors and said switching transistors are NPN transistors of the vertical inverse type.

9. An integrated injection logic circuit as claimed in claim 1, wherein the ratio of the currents supplied by the injector of said input transistor of the amplifier and the injector of said controlled transistor is greater than 10.

10. A threshold-effect integrated injection logic circuit with hysteresis comprising a trigger circuit including an input and an output; a diode connected to said input; a first and a second transistor each having an emitter, a base, and one or more collectors, a collector of each transistor being connected to the base of the other transistor, the emitters of said first and said second transistors being connected together and having a first voltage level, said first transistor including a second collector connected to said output, the base of said second transistor being connected to said diode;

a current amplifier comprising a switching transistor having an emitter, a base, and a collector, the emitter of said switching transistor being connected to a voltage terminal having a first voltage level, the base of said switching transistor being connected to said input, and the collector of said switching transistor being functionally connected to said base of said first transistor;

current injectors connected to said first transistor and to said switching transistor for supplying current thereto, said current supplied to said switching transistor being greater than the current supplied to said first transistor; and interruption means connected between said input and a voltage terminal having an open state and a closed state;

the sum of the internal voltage drop across the said diode and the voltage drop introduced by said interruption means in the closed state being smaller than the sum of said first voltage level and the internal voltage drop across the emitter-base junction of said first transistor.

* * * * *